United States Patent
Orban et al.

(10) Patent No.: US 7,852,677 B2
(45) Date of Patent: Dec. 14, 2010

(54) METHOD OF USING HOT-CARRIER-INJECTION DEGRADATION AS A PROGRAMMABLE FUSE/SWITCH

(75) Inventors: Richard Orban, Raleigh, NC (US); Leonel R. Nino, Jr., Raleigh, NC (US)

(73) Assignee: Qimonda AG, Munich (DE)

( * ) Notice: Subject to any disclaimer, the term of this patent is extended or adjusted under 35 U.S.C. 154(b) by 311 days.

(21) Appl. No.: 11/828,254

(22) Filed: Jul. 25, 2007

(65) Prior Publication Data

US 2009/0027969 A1    Jan. 29, 2009

(51) Int. Cl.
*G11C 16/04*    (2006.01)

(52) U.S. Cl. .............. 365/185.18; 365/185.2; 365/185.22; 365/185.23; 365/185.28; 365/185.29

(58) Field of Classification Search ............ 365/185.18, 365/185.2, 185.22, 185.23, 185.28, 185.29
See application file for complete search history.

(56) References Cited

U.S. PATENT DOCUMENTS

| 6,215,324 | B1 * | 4/2001 | Yoshida ............... 324/760 |
| 2004/0151029 | A1 * | 8/2004 | Forbes et al. ......... 365/185.28 |
| 2005/0083726 | A1 * | 4/2005 | Auclair et al. ......... 365/154 |

* cited by examiner

*Primary Examiner*—Hoai V Ho
*Assistant Examiner*—Fernando N Hidalgo
(74) *Attorney, Agent, or Firm*—Patterson & Sheridan, LLP (57) ABSTRACT

Method and apparatus for providing nonvolatile storage with a programmable transistor. The method includes receiving a data value to be stored in the programmable transistor and programming the programmable transistor to store the received data value. Programming includes applying a selected voltage to the programmable transistor. The selected voltage is selected to inject carriers into a gate oxide layer of the programmable transistor. The carriers are maintained in the gate oxide layer of the programmable transistor in the absence of the selected voltage, thereby programming the programmable transistor with the received data value.

13 Claims, 8 Drawing Sheets

METHOD OF USING HOT-CARRIER-INJECTION DEGRADATION AS A PROGRAMMABLE FUSE/SWITCH

BACKGROUND OF THE INVENTION

Modern memory types include volatile memory and non-volatile memory. Both types of memory are used to store and retrieve information. Non-volatile memory is capable of storing information even after the memory is disconnected from a power supply. Thus, when the non-volatile memory is subsequently connected to a power supply and powered up, information previously stored in the non-volatile memory may be accessed. In contrast, volatile memory is typically incapable of storing information when the memory is disconnected from a power supply for a given period of time.

In some cases, there may be a desire to provide non-volatile and volatile memory storage capability for a single device. For example, after manufacturing a volatile memory device, the device may be tested to determine if there are any defects in the device. The device may also include repair circuits which may be used to repair defects in the device. In order to record test and repair information without losing the information when the device is disconnected from a power supply, non-volatile storage within the device may be used.

In some cases, providing non-volatile memory storage capability to a device may undesirably increase the cost of the device. For example, some non-volatile storage techniques may use additional manufacturing steps or materials which increase the cost of the device. Other non-volatile storage techniques, such as using laser-blown fuses to store information, may be undesirably restricted to storing information only at certain times in the manufacturing process, for example, before the device has been packaged.

Accordingly, what is needed is an improved method and apparatus for providing non-volatile memory storage.

SUMMARY OF THE INVENTION

Embodiments of the invention generally provide a method and apparatus for providing non-volatile memory storage. In one embodiment, the method includes receiving a data value to be stored in the programmable transistor and programming the programmable transistor to store the received data value. Programming includes applying a selected voltage to the programmable transistor. The selected voltage is selected to inject carriers into a gate oxide layer of the programmable transistor. The carriers are maintained in the gate oxide layer of the programmable transistor in the absence of the selected voltage, thereby programming the programmable transistor with the received data value.

One embodiment of the invention provides an integrated circuit device. The device includes a programmable transistor and circuitry configured to receive a data value to be stored in the programmable transistor. The circuitry is also configured to program the programmable transistor to store the received data value. Programming includes applying a selected voltage to the programmable transistor. The selected voltage is selected to inject carriers into a gate oxide layer of the programmable transistor. The carriers are maintained in the gate oxide layer of the programmable transistor in the absence of the selected voltage, thereby programming the programmable transistor with the received data value.

One embodiment of the invention provides a test system including a test device and an integrated circuit device. The integrated circuit device includes a programmable transistor and circuitry configured to receive a data value to be stored in the programmable transistor from the test device. The circuitry is also configure to program the programmable transistor to store the received data value. Programming includes applying a selected voltage to the programmable transistor. The selected voltage is selected to inject carriers into a gate oxide layer of the programmable transistor. The carriers are maintained in the gate oxide layer of the programmable transistor in the absence of the selected voltage, thereby programming the programmable transistor with the received data value.

One embodiment of the invention also provides a method for providing nonvolatile storage in a programmable transistor. The method includes receiving a data value to be stored in the programmable transistor and programming the programmable transistor to store the received data value. Programming includes applying a selected positive voltage to a gate and a drain of the programmable transistor. The selected positive voltage is selected to inject carriers into a gate oxide layer of the programmable transistor via hot carrier injection. The carriers are maintained in the gate oxide layer of the programmable transistor in the absence of the selected positive voltage, thereby programming the programmable transistor with the received data value.

One embodiment of the invention further provides a method for providing nonvolatile storage in a programmable transistor. The method includes receiving a data value to be stored in the programmable transistor and programming the programmable transistor to store the received data value. Programming includes applying a selected negative voltage to a gate of the programmable transistor at a selected temperature. The selected negative voltage is selected to inject carriers into a gate oxide layer of the programmable transistor via negative bias temperature instability. The carriers are maintained in the gate oxide layer of the programmable transistor in the absence of the selected negative voltage and the selected temperature, thereby programming the programmable transistor with the received data value.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a method and apparatus for providing non-volatile memory storage. In one embodiment, the method includes receiving a data value to be stored in the programmable transistor and programming the programmable transistor to store the received data value. Programming includes applying a selected voltage to the programmable transistor. The selected voltage is selected to inject carriers into a gate oxide layer of the programmable transistor. The carriers are maintained in the gate oxide layer of the programmable transistor in the absence of the selected voltage, thereby programming the programmable transistor with the received data value.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

Figure 1A:
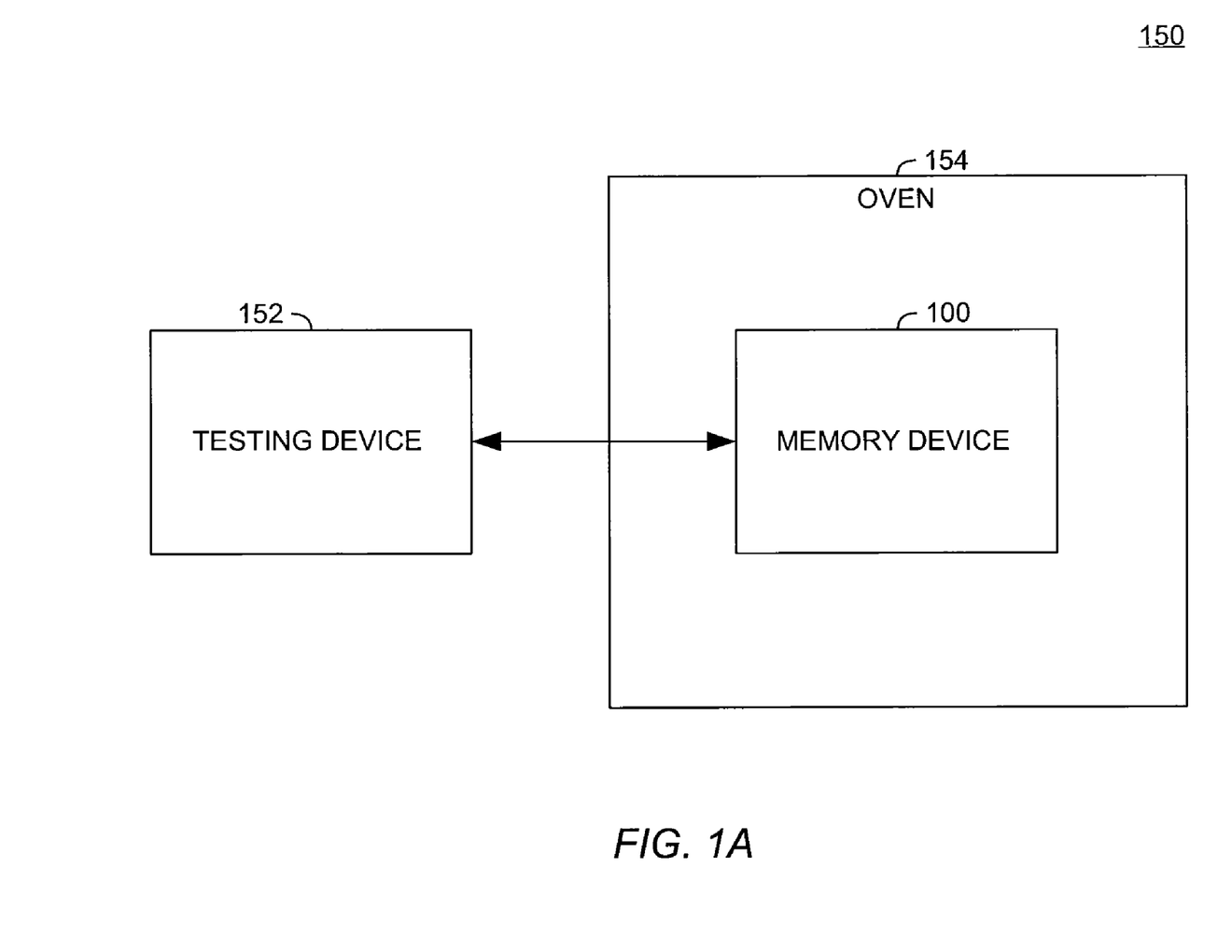
FIGS. 1A-B are block diagrams depicting a test system and memory device according to one embodiment of the invention.

FIG. 1 is a block diagram depicting a test system 150 for testing a memory device 100 according to one embodiment of the invention. In one embodiment, the memory device 100 may be tested using an external testing device 152. In some cases, the memory device 100 may also include internal circuitry capable of supplementing or replacing the external testing device 152. The internal circuitry may include, for example, built-in self-test (BIST) circuitry for testing the memory device 100. In some cases, testing of the memory device 100 may be performed in an oven 154, for example, to increase stress on the memory device 100 and/or to increase the temperature of the memory device 100 during programming as described below.

Figure 1B:
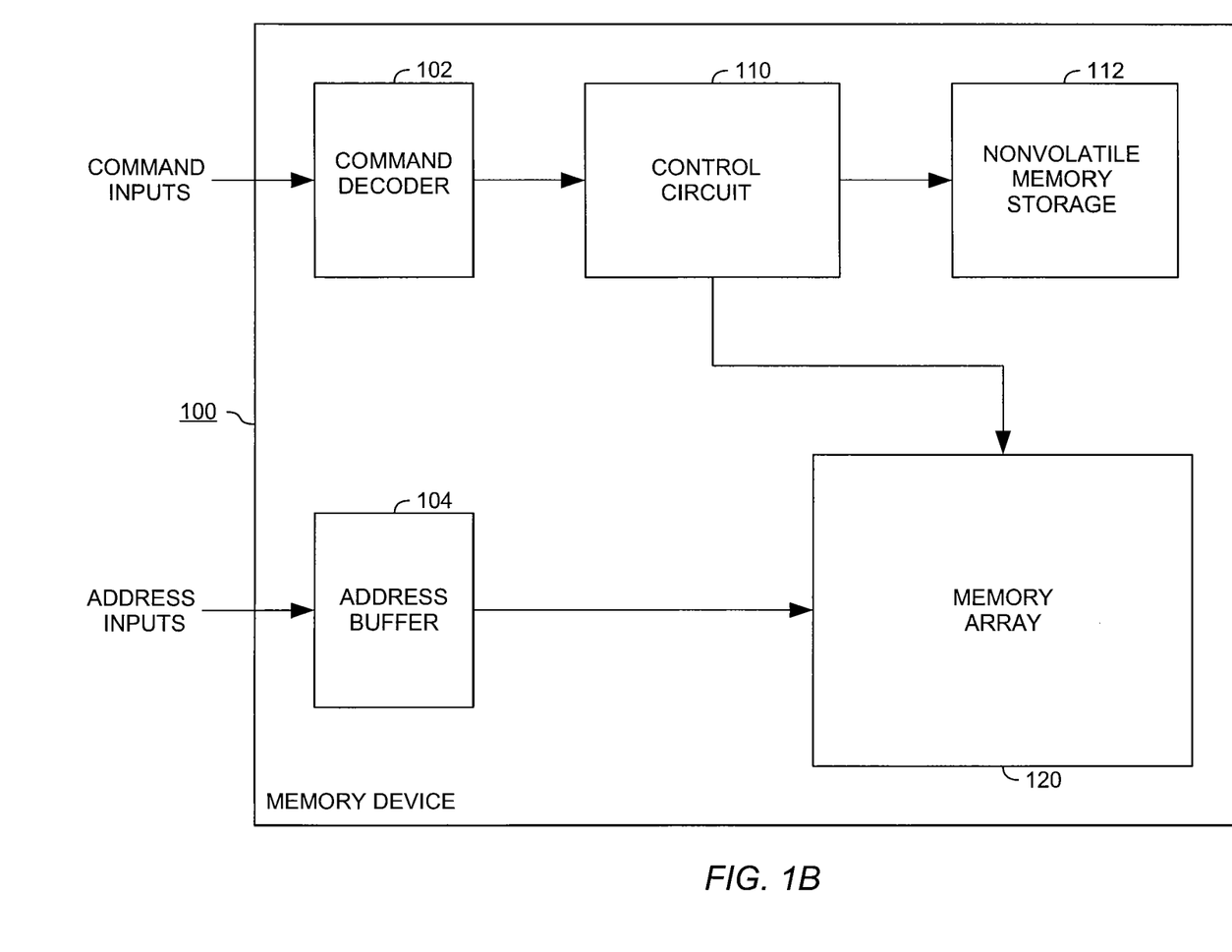

FIG. 1B is a block diagram depicting aspects of the memory device 100 according to one embodiment of the invention. The memory device 100 may include address inputs and command inputs. The address inputs may be received by an address buffer 104 and the command inputs may be received by a command decoder 102. The command decoder 102 may decode commands and provide decoded command information to a control circuit 110. The control circuit 110 may use the decoded command information in addition to the address inputs to access information in a memory array 120. In some cases, the device 100 may include multiple memory arrays 120 which may be accessed.

Figure 2:
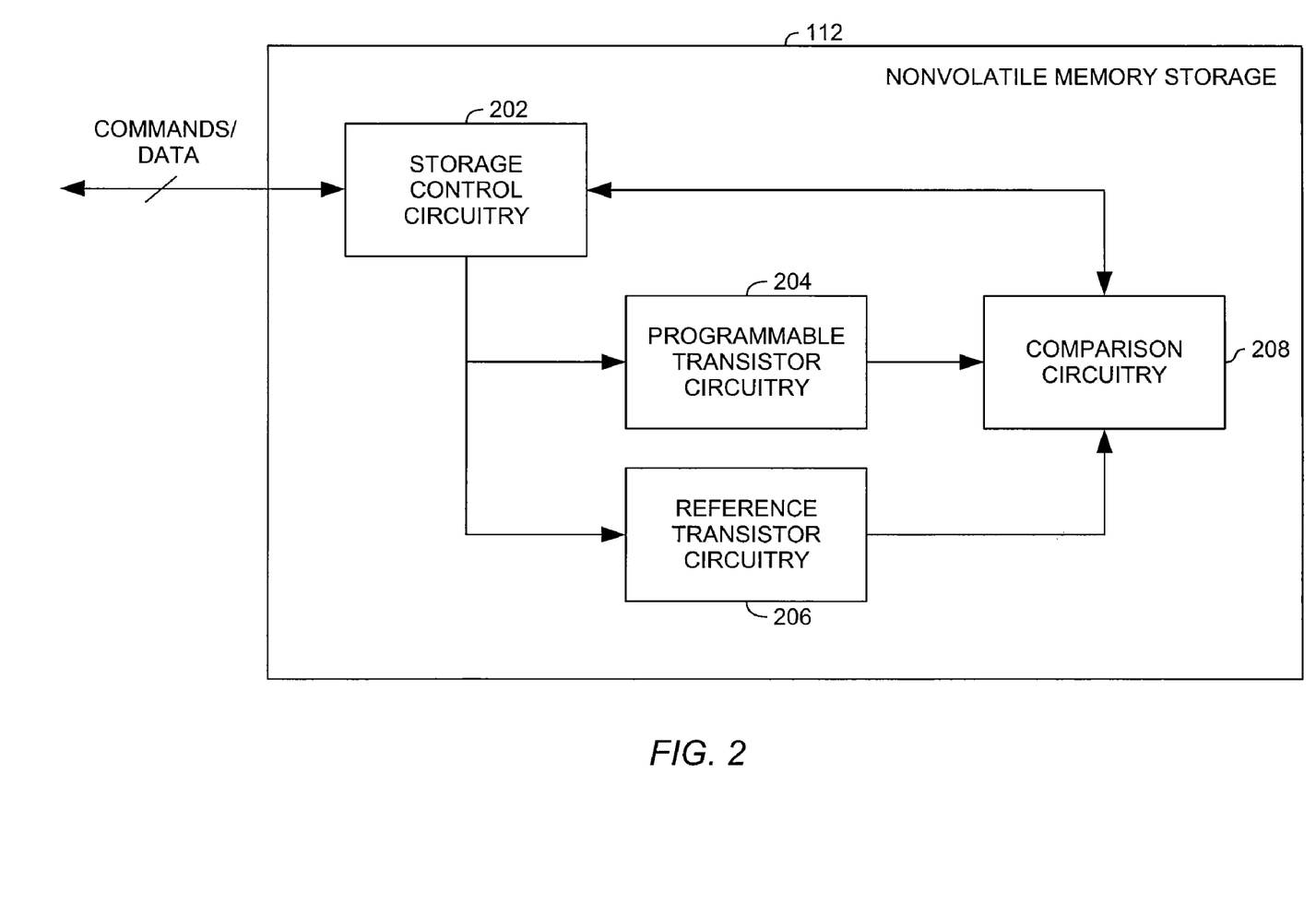
FIG. 2 is a block diagram depicting nonvolatile memory storage according to one embodiment of the invention.

In one embodiment of the invention, the memory device 100 may include nonvolatile memory storage 112. FIG. 2 is a block diagram depicting aspects of the nonvolatile memory storage 112 according to one embodiment of the invention. As depicted, the nonvolatile memory storage 112 may include storage control circuitry 202 which may receive and transmit commands and/or data to and from the control circuitry 110. Upon receiving a program command and data, the storage control circuitry 202 may be configured to program one or more transistors using programmable transistor circuitry 204. The programmable transistor circuitry 204 may provide nonvolatile storage of the stored information. Thus, even when the memory device 100 is not being powered, the programmable transistor circuitry 204 may maintain a copy of the information stored therein. The storage control circuitry 202 may also be configured to read programmed data from the programmable transistor circuitry 204 using reference transistor circuitry 206 and comparison circuitry 208 as described in greater detail below.

As previously mentioned, one embodiment of the invention provides a programmable transistor which may be modified (referred to herein as programming) in order to store a bit of information. In one embodiment, the programmable transistor may be a conventional transistor (e.g., a metal-oxide-semiconductor field effect transistor, or MOSFET). The programmable transistor circuitry 204 may provide a plurality of such programmable transistors. To store a binary bit '1' in the programmable transistor, one or more operating characteristics of the transistor may be modified. To store a binary bit '0' in the transistor, no modifications may be made to the operating characteristics of the transistor. Optionally, where desired, modified operating characteristics of the transistor may correspond to a binary '0' and unmodified operating characteristics may correspond to a binary '1'. Thus, a programmable transistor may be placed in a programmed state or a non-programmed state, with each state corresponding to a given bit value '0' or '1'.

In one embodiment, during a read operation, the operating characteristics of the programmable transistor may be compared to the operating characteristics of an unmodified transistor (a reference transistor). If the operating characteristics of the programmable transistor match the operating characteristics of the reference transistor, then a comparison circuit may indicate that the programmable transistor has not been programmed and that a binary bit '0' is stored in the programmable transistor. If the operating characteristics of the programmable transistor do not match the operating characteristics of the reference transistor, then a comparison circuit may indicate that the programmable transistor has been programmed and that a binary bit '1' is stored in the programmable transistor. Optionally, as understood by those skilled in the art, the non-programmed transistor may correspond to a binary bit '1' while the programmed transistor may correspond to a binary '0'.

Figure 3:
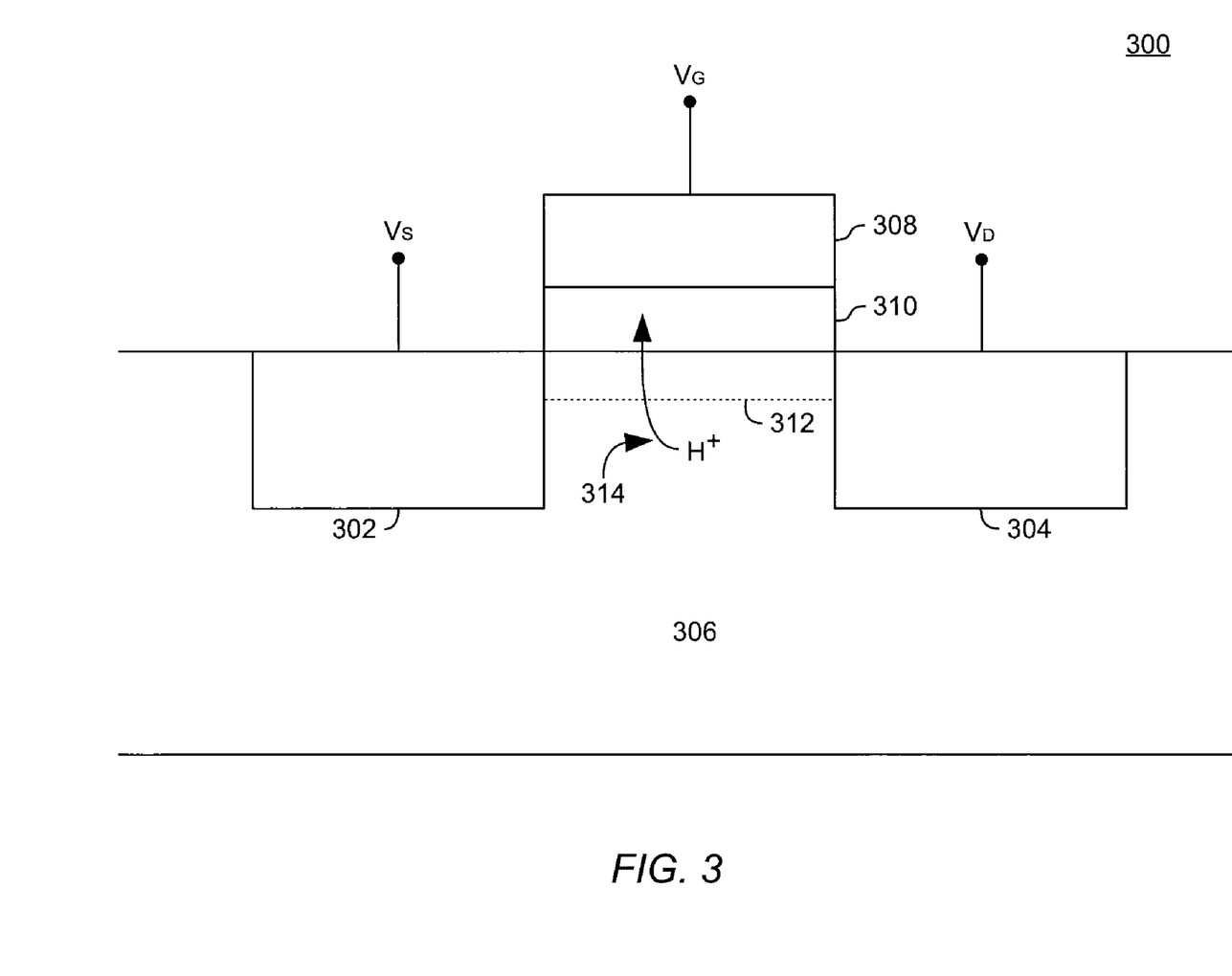
FIG. 3 is a block diagram depicting a programmable transistor according to one embodiment of the invention.

In one embodiment of the invention, the operating characteristics of the transistor may be modified by using hot carrier injection 314 as described with respect to the conventional MOSFET transistor 300 depicted in FIG. 3. The transistor 300 may be fabricated on a substrate 306 and may include a source 302, gate 308, and drain 304. The gate 308 may be formed over a gate oxide layer 310. During normal operation of the transistor 300, when the gate voltage $V_G$ is lower than a threshold voltage of the transistor 300 (for a p-type field effect transistor, or PFET), the transistor 300 may be turned on, creating a channel 312 between the source 302 and the drain 304 in which current between the source 302 and drain 304 may flow. If the gate voltage $V_G$ increases above the threshold voltage, then the channel 312 may dissipate, thereby preventing current flow between the source 302 and drain 304 and turning the transistor 300 off.

Hot carrier injection 314 refers to the injection of carriers such as electrons (e−) or holes (h+) into the gate oxide layer 310. In one embodiment, hot carrier injection may be performed by applying one or more selected voltages to the transistor 300. In some cases, to improve the number of injected carriers, a selected temperature may be applied to the programmable transistor 300 (e.g., by heating the memory device 100 in the oven 154). By applying appropriate voltages to the transistor 300, carriers such as holes (h+) as depicted in FIG. 3 may be injected into the gate oxide layer 310 from the substrate 306 and become trapped, thereby remaining in the gate oxide layer 310 even after the selected voltage and/or selected temperature are no longer applied to the transistor 300.

In one embodiment, hot carrier injection 314 may modify operating characteristics of the transistor by increasing a subthreshold leakage current $I_{SUB}$ of the transistor 300. An increase in subthreshold leakage current $I_{SUB}$ may be detected as an increase in current from the transistor 300 when the transistor 300 is placed in a standby mode (e.g., when the transistor 300 is turned off). The $I_{SUB}$ current may flow from the source 302 to the drain 304 of the transistor 300 and may be caused by the injected carriers in the gate oxide layer 310 acting as traps (e.g., electrical charges) which reduce the effective length of the transistor 300.

In another embodiment, hot carrier injection 314 may modify operating characteristics of the transistor by preventing the transistor 300 from turning on fully. Where the transistor 300 is prevented from turning on fully, the modification may be detected as an increase in the threshold voltage of the transistor 300, an increase in the amount of time for the transistor 300 to turn on, and a corresponding decrease in the drain to source current $I_{DS}$ from the transistor 300 when a given voltage is applied to the gate 308 of the transistor 300.

In either of the foregoing two embodiments, by comparing the current of the programmable transistor 300 to an unmodified reference transistor, the state of the programmable transistor 300 may be determined.

Figure 4:
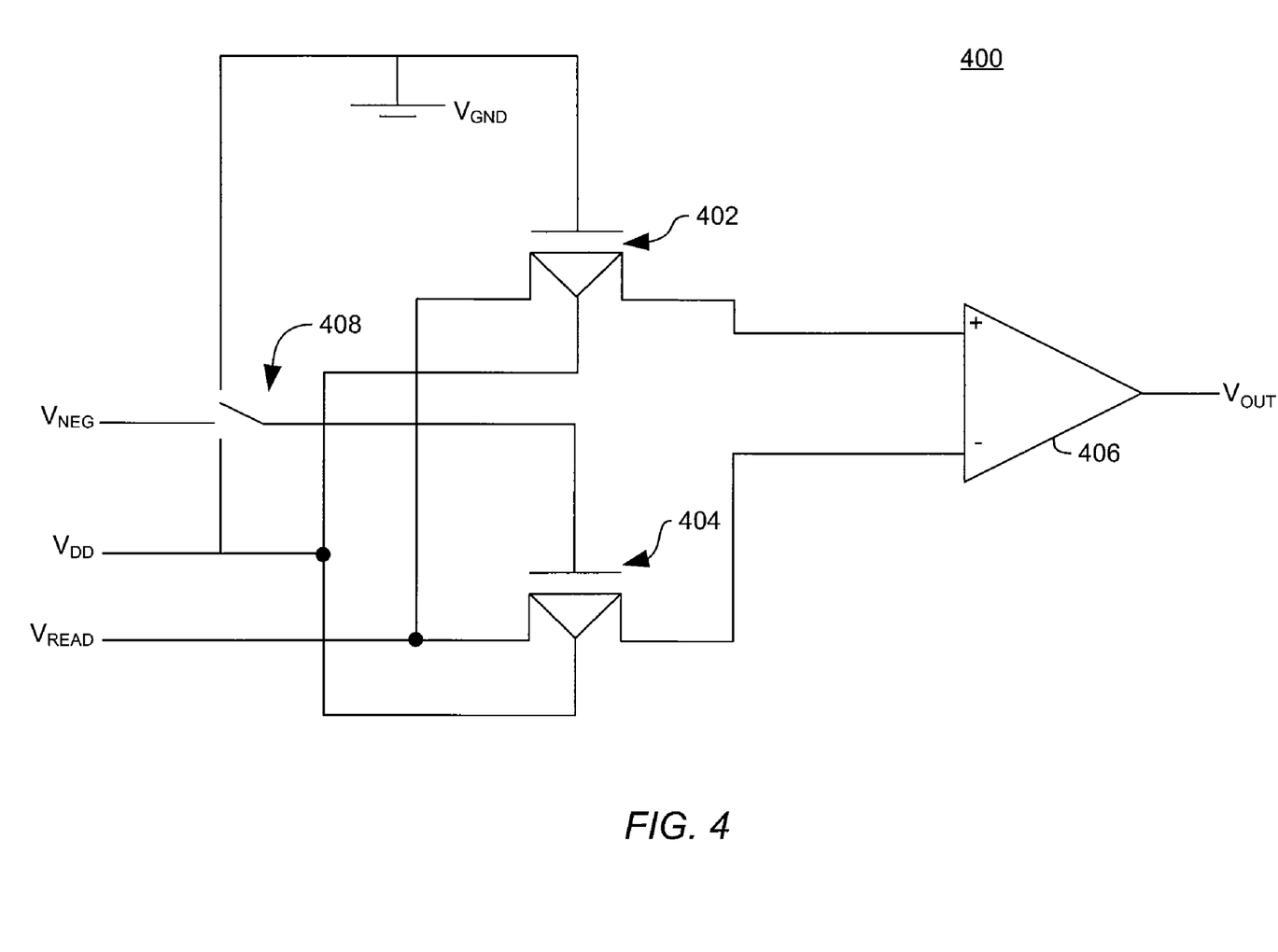
FIG. 4 is a block diagram depicting a first circuit for programming and reading a programmable transistor for nonvolatile memory storage according to one embodiment of the invention.

FIG. 4 is a block diagram depicting a first circuit 400 for programming and reading a programmable transistor for nonvolatile memory storage according to one embodiment of the invention. As depicted, the circuit 400 may include a reference transistor 402, a programmable transistor 404, a current comparator circuit 406, and a switching circuit 408. One or more of the elements of FIG. 4 may be implemented in elements of FIG. 2. For example, with reference to FIGS. 2 and 4, the reference transistor 402 may be included as part of the reference transistor circuitry 206, the programmable transistor may be included as part of the programmable transistor circuitry 204, and the current comparator circuit 406 may be included as part of the comparison circuitry 208. The switching circuit 408 may be used to apply selected voltages to the programmable transistor 404 during programming and may be included as part of the storage control circuit 202.

In one embodiment, where multiple bits of nonvolatile data storage are desired, multiple programmable transistors 404 may be provided. Where multiple programmable transistors 404 are provided, separate reference transistors 402 and current comparator circuits 406 may be provided for each programmable transistor 404. Optionally, in one embodiment, a group of multiple programmable transistors 404 may share a reference transistor 402 and current comparator circuit 406.

Figure 5:
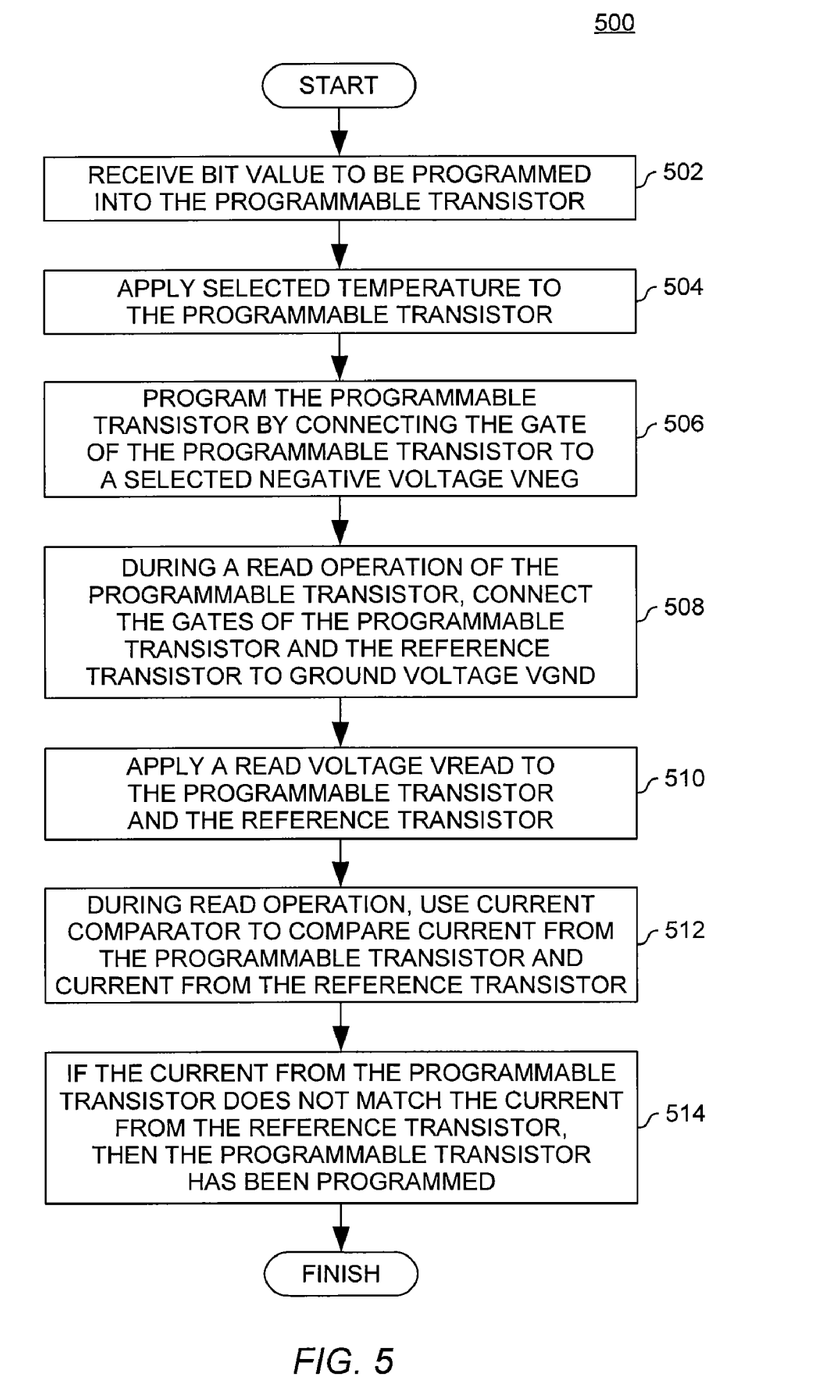
FIG. 5 is a flow diagram depicting a first method for providing a programmable transistor for nonvolatile memory storage according to one embodiment of the invention.

FIG. 5 is a flow diagram depicting a process 500 for using the circuit 400 of FIG. 4 to program and read the programmable transistor 404 according to one embodiment of the invention. The process 500 may begin at step 502 where a bit value to be programmed into the programmable transistor 404 is received. At step 504, in preparation for programming, a selected temperature may be applied to the programmable transistor 404. In one embodiment, the selected temperature may be applied by heating the memory device 100 in an oven 154, which, as described above, may also be used during testing of the memory device 100. Optionally, the memory device 100 may be heated by any appropriate external heating apparatus such as an external heating element and/or by any appropriate internal heating apparatus such as a heating element which is internal to the memory device 100 and placed proximally to the programmable transistor 404.

At step 506, the programmable transistor 404 may be programmed by connecting the gate of the programmable transistor to a selected negative voltage, VNEG. In one embodiment, the selected temperature and selected negative voltage may be selected to cause carrier injection (in this case, injection of holes) into the gate oxide layer 310 of the programmable transistor 404 via the mechanism of negative bias temperature instability (NBTI). NBTI may occur when a negative electrical field (VNEG) is applied to the gate 308 of the programmable transistor 404 at increased temperatures, for example, temperatures which are at or above approximately 100 degrees Celsius. VNEG may be measured with respect to the gate to source voltage (VGS) minus the threshold voltage (VTH) for the transistor 300. In some cases, NBTI may occur at gate voltages just above VTH which may be equal to approximately −1V. As a result of NBTI, holes may be injected into the gate oxide layer 310 of the programmable transistor 404, thereby preventing the transistor 404 from completely turning on and increasing the subthreshold leakage current $I_{SUB}$. Where the transistor 404 is prevented from turning on, the programming may be detected as a decrease in the drain 302 to source 304 current $I_{DS}$.

In one embodiment, after the programmable transistor 404 has been programmed, a read operation may be performed. At step 508, during the read operation, the gates 308 of the programmable transistor 404 and the reference transistor 402 may be connected to the ground voltage VGND. Then, at step 510, a read voltage VREAD may be applied to the drain 304 of the programmable transistor 404 and the reference transistor 402. By applying the read voltage VREAD to the drain 304 of the transistors 402, 404, the current $I_{DS}$ may be induced from the drain 304 to the source 302 of the transistors 402, 404.

As described above, where the programmable transistor 404 has been programmed, the source to drain current $I_{DS}$ for the programmable transistor 404 may be decreased with respect to the $I_{DS}$ induced in the reference transistor 402. Accordingly, at step 512, during the read operation, the current comparator 406 may be used to compare the current $I_{DS}$ from the programmable transistor 404 and the current $I_{DS}$ from the reference transistor 402. At step 514, if the current from the programmable transistor 404 does not match the current from reference transistor 402, then a determination may be made that the programmable transistor 404 has been programmed, thereby indicating the bit value stored by the programmable transistor 404. Optionally, as described above, the subthreshold leakage current of the programmable transistor 404 and the reference transistor 402 may be compared to determine if the programmable transistor 404 has been programmed. Where the programmable transistor 404 has been programmed, the subthreshold leakage current of the transistor 404 may be increased.

After the programmable transistor 404 has been programmed and the temperature and voltages used to program the transistor 404 are no longer applied to the transistor 404, the programmable transistor 404 may still maintain the carriers injected into the gate oxide layer 310 of the transistor 404 without the carriers migrating out of the gate oxide layer 310. Thus, as described above, the programmable transistor 404 may remain programmed and provide nonvolatile memory storage.

In some cases, there may be a desire to remove the carriers, if any, from the gate oxide layer 310 of the programmable transistor 404, thereby erasing the programmable transistor 404. Accordingly, in one embodiment, the programmable transistor 404 may be erasable. For example, during an erase operation, the selected temperature may be applied to the programmable transistor 404 and the carriers in the gate oxide layer 310 may be removed from the layer 310 by applying an erase voltage to the gate 308 of the programmable transistor 404. The erase voltage may be applied by the switching circuit 408 and may be a positive voltage such as VDD.

Figure 6:
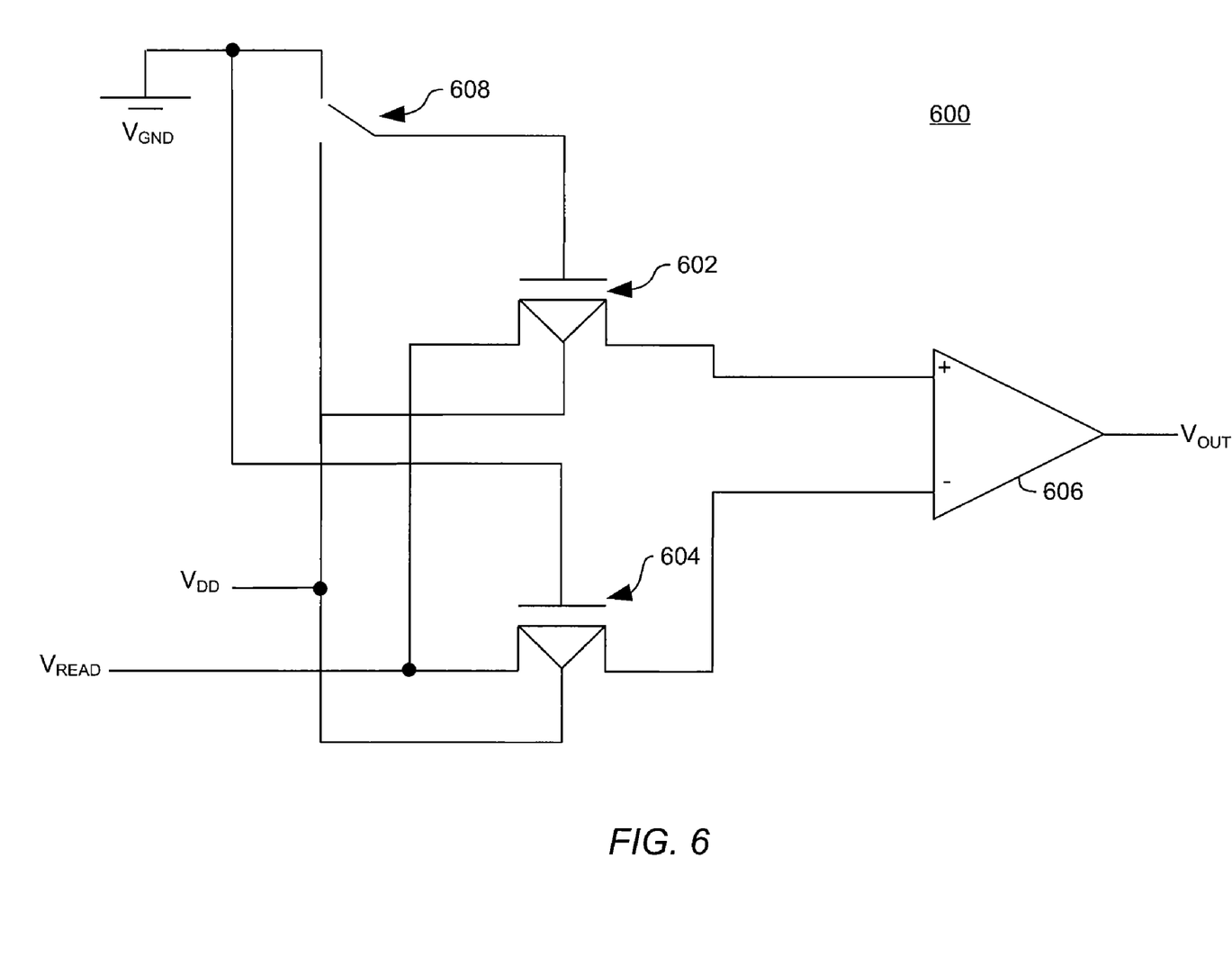
FIG. 6 is a block diagram depicting a second circuit for programming and reading a programmable transistor for nonvolatile memory storage according to one embodiment of the invention.

While described above with programming transistor 404 using negative bias temperature instability (NBTI), in another embodiment of the invention, a transistor may be programmed using hot-carrier charge injection (HCI). During HCI, a sufficiently large voltage applied under the gate oxide layer 310 may be used to create energetic holes which are injected into the gate oxide layer 310. FIG. 6 is a block diagram depicting a circuit 600 for programming a transistor 602 using HCI according to one embodiment of the invention. As depicted, the circuit 600 may also include a reference transistor 604 and current comparator 606 for comparing one or more operating characteristics of the programmable transistor 602 as well as a switching circuit 608 for applying selected voltages to the programmable transistor 602 as described below.

Figure 7:
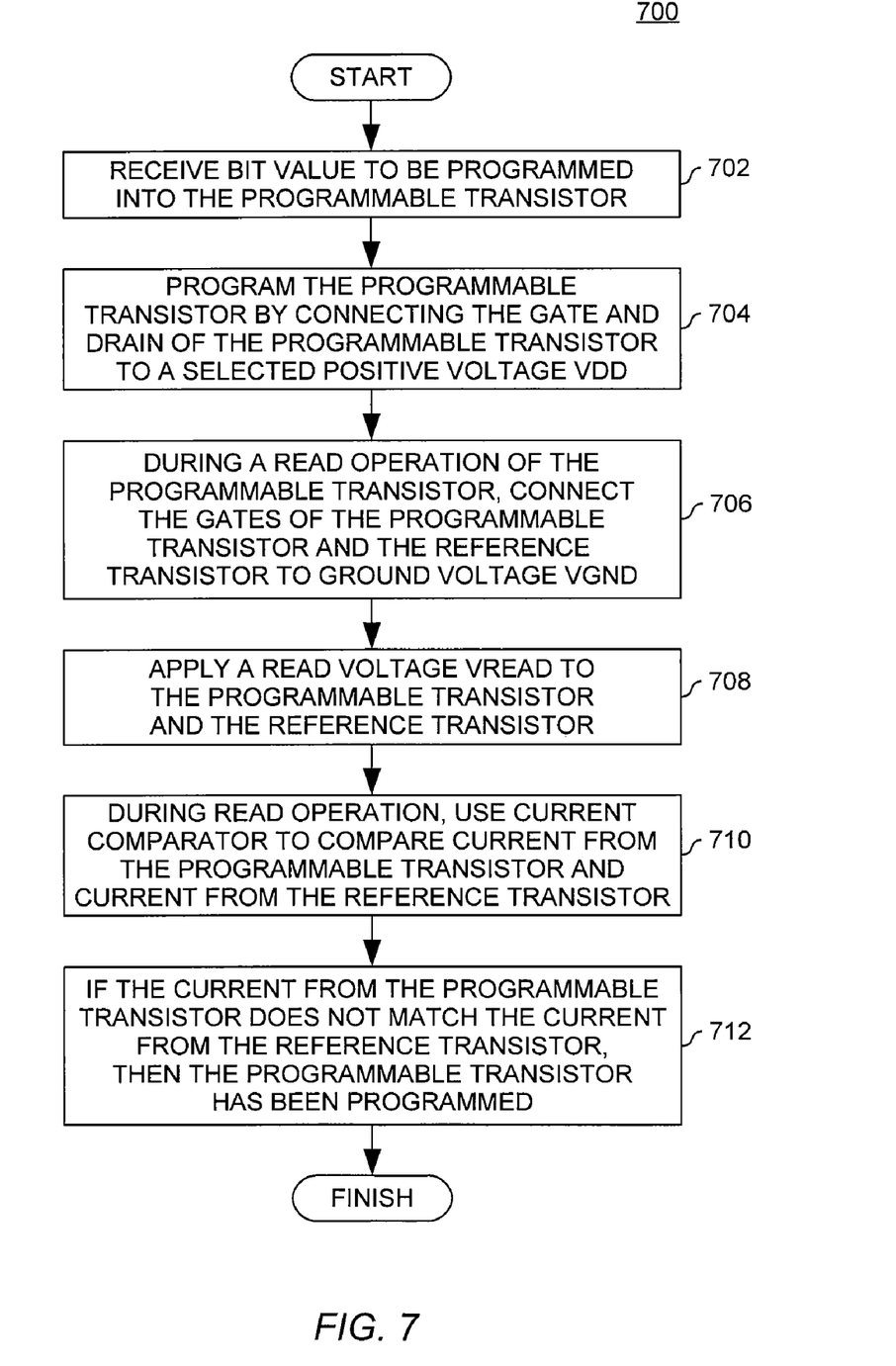
FIG. 7 is a flow diagram depicting a second method for providing a programmable transistor for nonvolatile memory storage according to one embodiment of the invention.

FIG. 7 is a flow diagram depicting a method 700 for programming and reading the programmable transistor 602 using circuit 600 according to one embodiment of the invention. The process 700 begins at step 702 where a bit value to be programmed into the programmable transistor 602 is received. At step 704, the programmable transistor 602 may be programmed by connecting the gate 308 and drain 304 of the transistor 602 to a selected positive voltage, for example, VDD. As described above, applying the selected positive voltage to the gate 308 and drain 304 of the programmable transistor 602 may cause the transistor 602 to be programmed via the HCI mechanism described above.

After the programmable transistor 602 has been programmed, a read operation may be performed. At step 706, during the read operation, the gates 308 of the programmable transistor 602 and the reference transistor 604 may be connected to the ground voltage VGND, thereby turning the transistors 602, 604 on. At step 708, a read voltage VREAD may be applied to the programmable transistor 602 and the reference transistor 604. By applying the read voltage VREAD to the drain 304 of the transistors 602, 604, the current $I_{DS}$ may be induced from the drain 304 to the source 302 of the transistors 602, 604. Then at step 710, during the read operation, the current comparator 606 may be used to compare the current from the programmable transistor 602 and the current from the reference transistor 604. As described above, where the programmable transistor 602 has been programmed, the drain to source current $I_{DS}$ may be decreased because the programmed transistor 602 may be prevented from fully turning on by the carriers injected into the gate oxide layer 310 of the transistor 602. Thus, at step 712, if the current from the programmable transistor 602 does not match the current from the reference transistor 604, then a determination may be made that the programmable transistor 602 has been programmed.

Optionally, as mentioned above, the state of the programmable transistor 602 may be determined by comparing the subthreshold leakage current $I_{SUB}$ (measured with the transistor 602 turned off) to the subthreshold leakage current $I_{SUB}$ of the reference transistor 604. Where the programmable transistor 602 has been programmed, the subthreshold leakage current $I_{SUB}$ of the transistor 602 may be increased with respect to the subthreshold leakage current $I_{SUB}$ of the reference transistor 604.

In one embodiment, an erase operation may be performed to erase the programmable transistor 602. In order to erase the programmable transistor 602, the transistor 602 may be heated to a selected temperature for a selected period of time, thereby causing any carriers previously injected into the gate oxide layer 310 of the transistor 602 to migrate out of the gate oxide layer 310. In one embodiment, transistor 602 may be erased by heating the transistor 602 at or above approximately 175 degrees Celsius for approximately 24 hours or more.

In one embodiment of the invention, the selected voltages used for programming as described above may be internally generated by the memory device 100. Optionally, one or more of the voltages used during programming, for example, the negative voltage VNEG, may be supplied from an external supply, such as the testing device 152. Furthermore, as described above, programming may be used to store test result data for the memory device 100 or other integrated circuit device. The test results may be generated by the memory device 100 (for example, after performing a built-in self test) or by another device such as the testing device 152. In one embodiment, of the invention, programming of the programmable transistor 300 may be performed before the memory device 100 has been packaged. Optionally, programming may be performed after the memory device 100 has been packaged, for example, during a burn-in test.

While the foregoing is directed to embodiments of the present invention, other and further embodiments of the invention may be devised without departing from the basic scope thereof, and the scope thereof is determined by the claims that follow.

What is claimed is:

1. A method of providing nonvolatile storage with a programmable transistor, comprising:
receiving a data value to be stored in the programmable transistor; and
programming the programmable transistor to store the received data value, wherein programming comprises:
exposing the programmable transistor to a predefined programming temperature while applying the selected voltage; and
applying a selected voltage to the programmable transistor, wherein the selected voltage is selected to inject carriers into a gate oxide layer of the programmable transistor while the programmable transistor is exposed to the predefined programming temperature, wherein the carriers are maintained in the gate oxide layer of the programmable transistor in the absence of the selected voltage, thereby programming the programmable transistor with the received data value;
performing a read operation from the programmable transistor, wherein the read operation comprises:
applying one or more read voltages to the programmable transistor and a reference transistor; and
comparing at least one operating characteristic of the programmable transistor and at least one operating characteristic of the reference transistor to determine if the programmable transistor is programmed; wherein the at least one operating characteristic is selected from:
a lower drain-to-source current of the programmable transistor relative to a drain-to-source current of the reference transistor; and
a higher subthreshold current of the programmable transistor relative to a subthreshold current of the reference transistor.

2. The method of claim 1, further comprising:
performing an erase operation for the programmable transistor, wherein the erase operation comprises exposing the programmable transistor to a predefined erase temperature for a selected time period, wherein the predefined erase temperature and the selected time period are selected to cause the carriers injected into the gate oxide layer to migrate out of the gate oxide layer.

3. The method of claim 1, further comprising:
performing an erase operation for the programmable transistor, wherein the erase operation comprises applying selected erase voltage while exposing the programmable transistor to heat at a selected erase temperature, wherein the selected erase temperature and the selected erase voltage are selected to cause the carriers injected into the gate oxide layer to migrate out of the gate oxide layer.

4. The method of claim 1, wherein the programmable transistor is part of an integrated circuit that includes a heating element and wherein exposing the programmable transistor to the predefined programming temperature comprises applying a voltage to the heating element to cause the heating element to radiate heat at the predefined programming temperature.

5. An integrated circuit device, comprising:
a programmable transistor; and
circuitry configured to:
receive a data value to be stored in the programmable transistor; and
program the programmable transistor to store the received data value, wherein programming comprises:
applying a selected voltage to the programmable transistor while the programmable transistor is exposed to a predefined programming temperature, wherein the selected voltage and the predefined programming temperature are selected to inject carriers into a gate oxide layer of the programmable transistor, wherein the carriers are maintained in the gate oxide layer of the programmable transistor in the absence of the selected voltage, thereby programming the programmable transistor with the received data value; and
perform a read operation from the programmable transistor, wherein the read operation comprises:
applying one or more read voltages to the programmable transistor and a reference transistor; and
comparing at least one operating characteristic of the programmable transistor and at least one operating characteristic of the reference transistor to determine if the programmable transistor is programmed; wherein the at least one operating characteristic is selected from:
a lower drain-to-source current of the programmable transistor relative to a drain-to-source current of the reference transistor; and
a higher subthreshold current of the programmable transistor relative to a subthreshold current of the reference transistor.

6. The device of claim 5, wherein the circuitry is further configured to:
perform an erase operation for the programmable transistor, wherein the erase operation comprises exposing the programmable transistor to a predefined erase temperature for a selected time period, wherein the predefined erase temperature and the selected time period are selected to cause the carriers injected into the gate oxide layer to migrate out of the gate oxide layer.

7. The device of claim 5, wherein the circuitry is further configured to:
perform an erase operation for the programmable transistor, wherein the erase operation comprises applying a selected erase voltage to the programmable transistor and exposing the programmable transistor to a predefined erase temperature, wherein the predefined erase temperature and the selected erase voltage are selected to cause the carriers injected into the gate oxide layer to migrate out of the gate oxide layer.

8. The device of claim 5, further comprising a heating element; wherein exposing the programmable transistor to the predefined programming temperature comprises applying a voltage to the heating element to cause the heating element to radiate heat at the predefined programming temperature.

9. A test system, comprising:
a test device; and
an integrated circuit device, comprising:
a programmable transistor; and
circuitry configured to:
receive a data value to be stored in the programmable transistor from the test device; and
program the programmable transistor to store the received data value, wherein programming comprises:
applying a selected voltage to the programmable transistor while the programmable transistor is exposed to a predefined programming temperature, wherein the selected voltage and the predefined programming temperature are selected to inject carriers into a gate oxide layer of the programmable transistor, wherein the carriers are maintained in the gate oxide layer of the programmable transistor in the absence of the selected voltage, thereby programming the programmable transistor with the received data value; and perform a read operation from the programmable transistor, wherein the read operation comprises:

applying one or more read voltages to the programmable transistor and a reference transistor; and comparing at least one operating characteristic of the programmable transistor and at least one operating characteristic of the reference transistor to determine if the programmable transistor is programmed; wherein the at least one operating characteristic is selected from:

a lower drain-to-source current of the programmable transistor relative to a drain-to-source current of the reference transistor; and a higher subthreshold current of the programmable transistor relative to a subthreshold current of the reference transistor.

10. The test system of claim 7, wherein the programmable transistor is one of a plurality of programmable transistors configured to provide nonvolatile storage for test results obtained from the test device.

11. The test system of claim 7, wherein the circuitry is further configured to:

perform an erase operation for the programmable transistor, wherein the erase operation comprises exposing the programmable transistor to a predefined erase temperature for a selected time period, wherein the predefined erase temperature and the selected time period are selected to cause the carriers injected into the gate oxide layer to migrate out of the gate oxide layer.

12. The test system of claim 9, wherein the circuitry is further configured to:

perform an erase operation for the programmable transistor, wherein the erase operation comprises applying a selected erase voltage to the programmable transistor and exposing the programmable transistor to a predefined erase temperature, wherein the predefined erase temperature and the selected erase voltage are selected to cause the carriers injected into the gate oxide layer to migrate out of the gate oxide layer.

13. The test system of claim 9, wherein the integrated circuit device further comprises a heating element; wherein exposing the programmable transistor to the predefined programming temperature comprises applying a voltage to the heating element to cause the heating element to radiate heat at the predefined programming temperature.

* * * * *